United States Patent [19]

Ostler et al.

[11] Patent Number: 5,594,913
[45] Date of Patent: Jan. 14, 1997

[54] HIGH SPEED MEMORY ACCESS SYSTEM FOR A MICROCONTROLLER WITH DIRECTLY DRIVEN LOW ORDER ADDRESS BITS

[75] Inventors: Farrell L. Ostler, Albuquerque, N.M.; Gregory K. Goodhue; Ori K. Mizrahi-Shalom, both of San Jose, Calif.

[73] Assignee: Philips Electronics North America Corporation, New York, N.Y.

[21] Appl. No.: 308,060

[22] Filed: Sep. 16, 1994

[51] Int. Cl.$^6$ ............................................ G06F 12/00
[52] U.S. Cl. .................. 395/800; 395/309; 395/421.08; 364/232.8; 364/240.5; 364/251; 364/DIG. 1
[58] Field of Search ........................ 395/800, 823, 395/824, 842, 843, 846, 847, 309, 402–406, 438, 411, 412, 421.01, 421.08, 421.1; 365/230.01, 230.02, 230.03, 230.04, 230.09

[56] References Cited

U.S. PATENT DOCUMENTS

| | | | |
|---|---|---|---|
| 4,727,481 | 2/1988 | Aguille et al. | 364/200 |
| 4,803,621 | 2/1989 | Kelly | 395/405 |
| 4,992,979 | 2/1991 | Aichelman, Jr. et al. | 365/230.03 |
| 5,243,701 | 9/1993 | Muramatsu et al. | 395/405 |
| 5,253,350 | 10/1993 | Foster et al. | 395/412 |
| 5,321,398 | 12/1994 | Ikeda | 341/67 |

*Primary Examiner*—Alpesh M. Shah

[57] ABSTRACT

A microcontroller which directly drives a memory with low order address bits during a fetch operation. Driving the low order address bits directly while the high order bits are latched during an address/data multiplex on the same pins allows the latch enable cycle to be skipped during sequential fetches. A sequential address detector indicates when the latch enable cycle can be skipped.

7 Claims, 3 Drawing Sheets

HIGH SPEED MEMORY ACCESS SYSTEM FOR A MICROCONTROLLER WITH DIRECTLY DRIVEN LOW ORDER ADDRESS BITS

BACKGROUND OF THE INVENTION

1. Field of the Invention

The present invention is directed to a microcontroller in which the low order address bits are directly driven and, more particularly, to a microcontroller in which the fetch cycle is shortened when the fetch address is sequential with the prior fetch address.

2. Description of the Related Art

Microcontrollers typically operate in a mode where instructions and data are fetched from an external memory in a sequential order for a large proportion of any period of execution. These microcontrollers typically time division multiplex address and data bits over some or all of the same external lines or pins to conserve external pin use. Because the same pins are used for both address and data, an external address latch is provided between the microcontroller and the external memory. This external latch stores the address output by the microcontroller and presents it to the memory while the external pins are used for data, so that the address can be applied to the memory throughout the read cycle. Each of the fetch cycles occupies several clock cycles one of which is a clock cycle where a latch enable signal is provided to the external latch. Because microcontrollers are being requested that operate at higher and higher speeds there is a need to reduce the number of clock cycles required for an instruction or data fetch and a need to speed up or optimize the fetch cycle.

Some microcontrollers directly drive address bits at the high order portion or most significant bits (MSB) of the address. However, because the high order address bits change relatively infrequently during sequential address fetches reducing address latching for the high order bits is not particularly helpful in reducing the length of a fetch cycle.

What is needed is a method of directly driving the low order or least significant bits (LSB) of the address in a way that reduces the cycle time for a fetch.

SUMMARY OF THE INVENTION

It is an object of the present invention to reduce the cycle time for sequential data and instruction fetches.

It is another object of the present invention to directly drive the least significant bits of the address provided by external microcontroller address pins.

The above objects can be attained by a system that directly drives the low order or least significant bits of an address supplied to an external memory device. A detector allows the present invention to determine when the high order bits change, so that the latching of the high order bits can be effected. The latching does not occur whenever the high order bits do not change, allowing the latch enable clock cycle to be skipped during a fetch cycle.

These together with other objects and advantages which will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

When sequential memory locations of an external memory are addressed one after another or sequentially, for a large part of the time only the low order bits of the address supplied to the memory change. If the sequential addressing continues for a long enough period the higher order address bits also change (are incremented). However, the change in the high order bits is relatively infrequent. By driving the low order bits directly and not multiplexing the low order bits while only the low order bits are changing, there is no need to latch the upper order bits into an external memory latch since they have not changed. That is, the external address latch need not be updated for a subsequent transfer if the new transfer address sequentially differs from the previous address only in the low order bits. This allows the latch enable clock cycle of the fetch cycle to be skipped, thereby reducing the time required for fetching data (instructions or operand data) from external memory. If only the lower order four (or the four least significant) bits are directly driven, only 1 in 16 sequential transfers require the overhead of address latching. The present invention, as described in detail below, preferably directly drives, or does not multiplex, only the four least significant bits, however, additional lower order bits, such as six, eight or more, can be directly driven.

Figure 1:
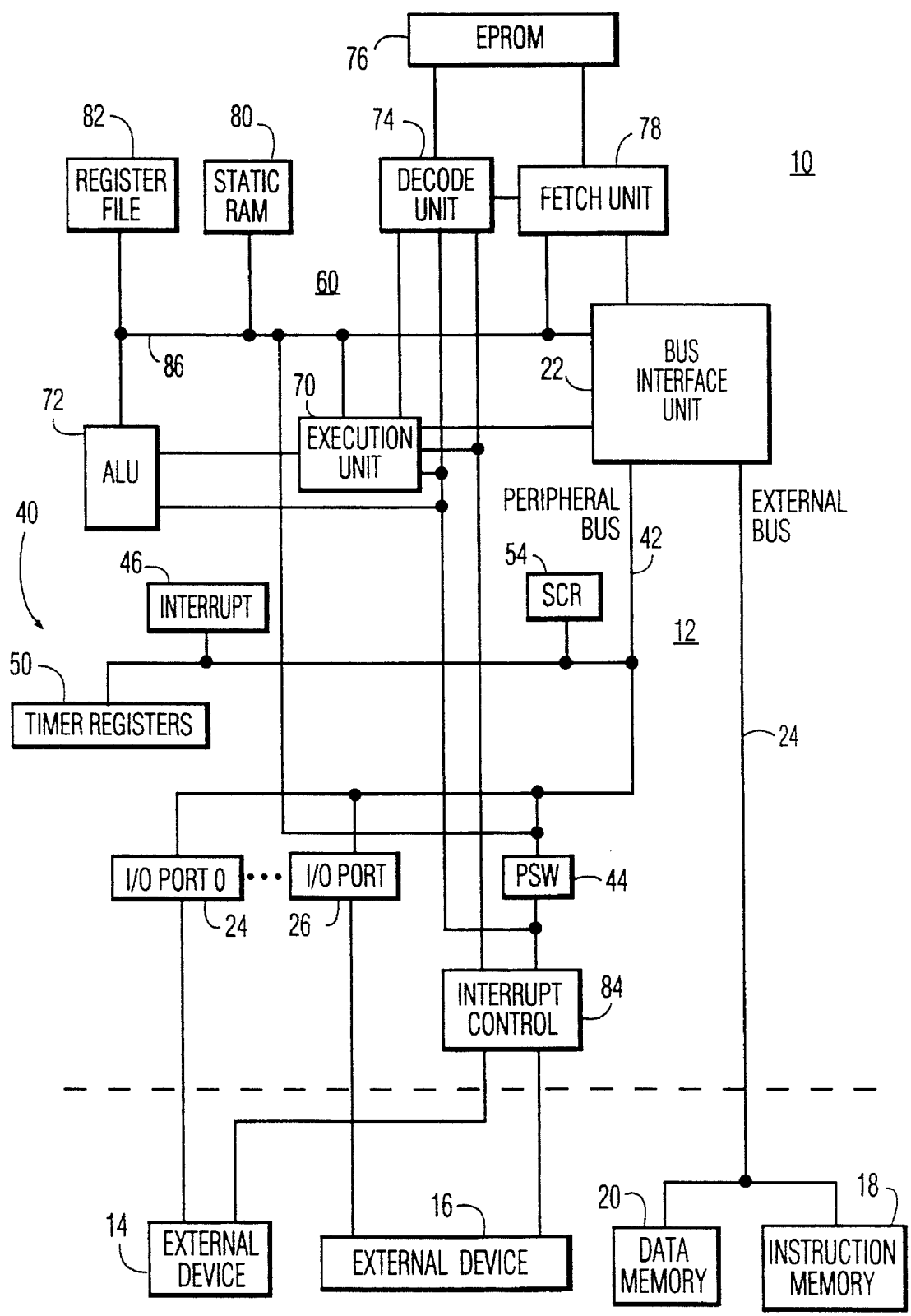
FIG. 1 depicts the architecture of a microcontroller according to the present invention.

The architecture of a microcontroller system 10 of present invention is illustrated in FIG. 1. This system 10 includes a single chip microcontroller 12 that performs 16 bit arithmetic operations and includes internal instruction and data storage. The microcontroller 12 supports external devices 14 and 16 and, through 24 bit external address capability, can support sixteen megabytes of external instruction storage 18 and sixteen megabytes of external data storage 20. Addresses of less than 24 bits, such as 20 bits as discussed below, can also be used. The microcontroller 12 includes a bus interface unit 22 which communicates with the external memories 18 and 20 over an external bi-directional address and data bus 24. A portion of the memory location address is presented to the memories 18 and 20 by an address latch 21. (FIG. 2) The microcontroller 12 communicates with the external devices 14 and 16 through I/O ports 26–28 which are addressable as special function registers (SFR) 40. The ports 26–28, as well as other special function registers, are addressable over an internal peripheral bus 42 through the bus interface unit 22. The data memory 20 can also be accessed as off-chip memory mapped I/O through the I/O ports 24–26. The on-chip special function registers 40, some of which are bit addressable, also include a program status word (PSW) register 44 coupled to an interruption control unit 84 communicating with the external devices as well as an ALU 72, the execution unit 70 and decode unit 74 for flag and general control, an interrupt register 46, timer registers 50 and a system configuration register (SCR) 54 containing system configuration bits. The program status word register is addressable over the peripheral bus 42 for general register operations and is also addressable over a connection to the internal bus 86 for other execution related operations. The bus interface unit 22 isolates the peripheral special function registers 40 and the external memories 18 and 20 from the microcontroller core 60. The core 60 includes a microcode programmable execution unit 70 which controls execution of instructions by the ALU 72 and the other units. The instructions decoded by the decode unit 74 are fetched from an internal EPROM 76, which is part of the instruction memory space, or from the external instruction memory 18 by a fetch unit 78 using the program counter (PC). (FIG. 2) Static RAM 80, which is part of the data memory space, as well as general purpose registers of a register file 82 are also available for instruction and data storage.

Figure 2:
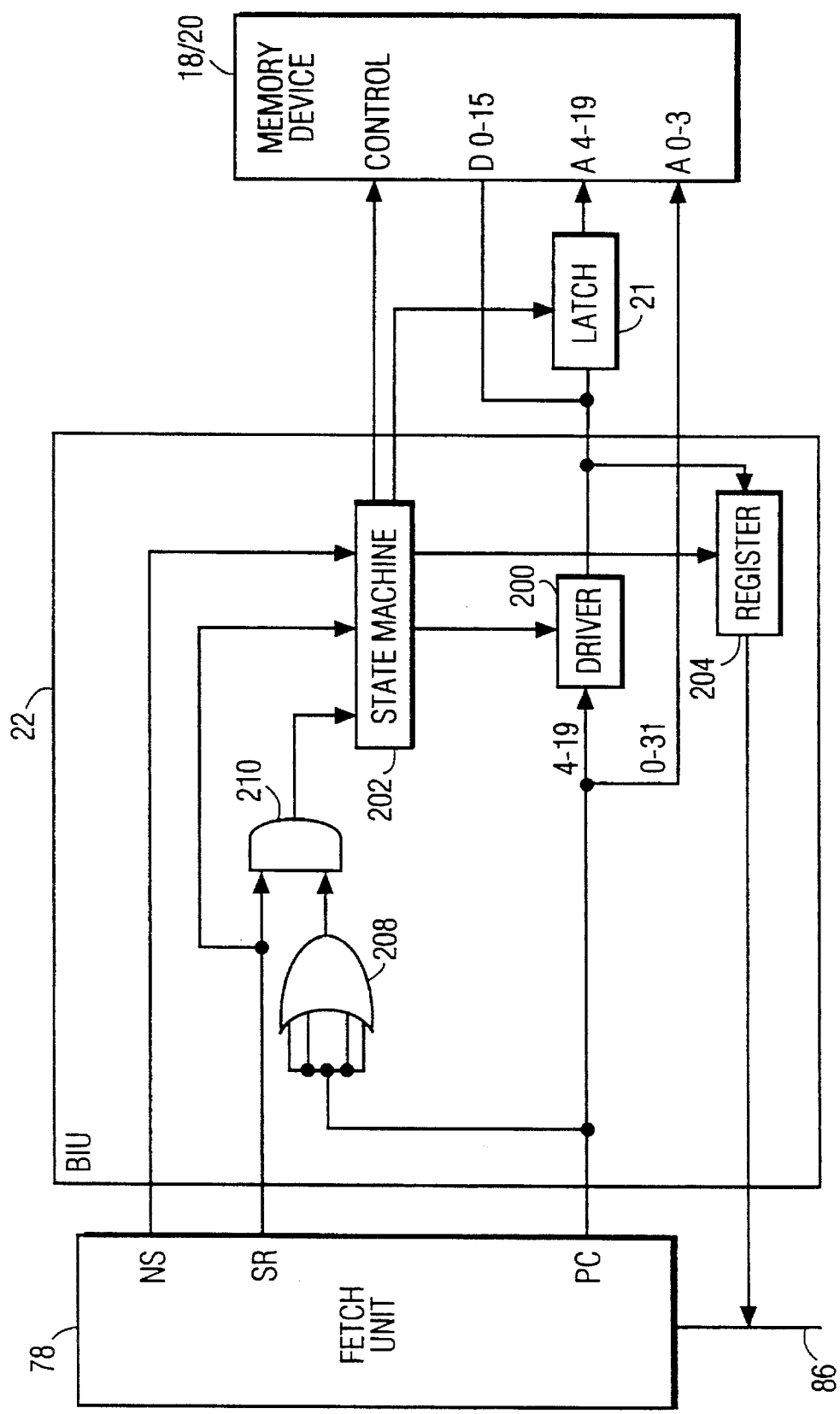
FIG. 2 illustrates a first embodiment of a bus interface unit 22 of the present invention.

Addressing the external memory 18 or 20 is performed through the bus interface unit (BIU) 22 which, as illustrated in more detail in FIG. 2, receives a program counter (PC) value from the fetch unit 78 indicating the address of an instruction to be fetched. During operand data fetches the address presented to the BIU 22 is provided by the execution unit 70 instead of the fetch unit 78. The address presented by the execution unit 70 is the address of the data being fetched. The execution unit 70 also presents data read and write control signals indicating whether the transfer is a read or write. The operations described below for the instruction fetch operation apply to the operand read or write. The fetch unit 78, during an instruction fetch, also presents a signal that indicates that the transfer request is a nonsequential request (NR) and a signal that indicates that the transfer is a sequential request (SR), which means that the current address being presented is the next sequential memory address after the last address presented. The SR signal is presented while the sequential fetching of instructions is in progress and the NR signal is presented whenever a branch in the instruction stream is encountered. During a nonsequential instruction fetch cycle the four lower order or least significant bits (LSB) of the address (bits 0–3 in the example of FIG. 2) are presented to the external memory 18 from the fetch unit 78 and the sixteen upper order or most significant bits (MSB), in this example bits 4–19, are presented to a driver 200 which is activated by a state machine 202. The driver 200 presents the address bits to the external latch 21. In the next clock cycle the latch 21 is activated by the state machine 202 to store the MSB in the latch 21 and the MSB are substantially immediately presented to the memory 18. The state machine 202 then turns off the driver 200 and presents the enable signal to the memory 18. The memory 18 performs a read and presents the data (an instruction in this case) to the BIU 22 over the same lines or pins as the MSB address bits were earlier presented. In the last clock cycle of the fetch cycle an instruction storage register 204 is activated to capture the data or output by the memory 18 and present it back to the fetch unit 78 if the data is an instruction or to present the data to the internal bus 86 if the data is an operand. Note that if the operation is a data write rather than a code fetch, a data register (not shown) would be provided for transferring data from the bus 86 to the memory 18/20 and would store the data being transferred.

During an instruction fetch cycle in which a sequential fetch is performed, the SR signal is presented to the BIU 22. In the first clock cycle the four LSB of the current address are examined by an OR gate 208 to determine if any of the bits are non-zero. If any of the bits are non-zero it indicates that an address increment carry has not been produced and the upper order bits of the address have not changed. If the upper order bits have not changed, the gate 208 produces a signal which means that an optimization of the fetch cycle is possible. The signal from the OR gate 208 is presented to an AND gate 210 which generates an optimization signal when the output from the gate 208 and the SR signal match. That is, when the fetch unit 78 indicates that a sequential address is being presented and the OR gate 208 indicates that the upper order address bits have not changed then the state machine 202 receives a signal indicating that the latch enable clock cycle can be skipped. The state machine in the next clock cycle proceeds to turn the driver 200 off and present the enable signal to the memory 18, thereby stopping the latch enable clock cycle. The last cycle as discussed above is then performed.

Figure 3:
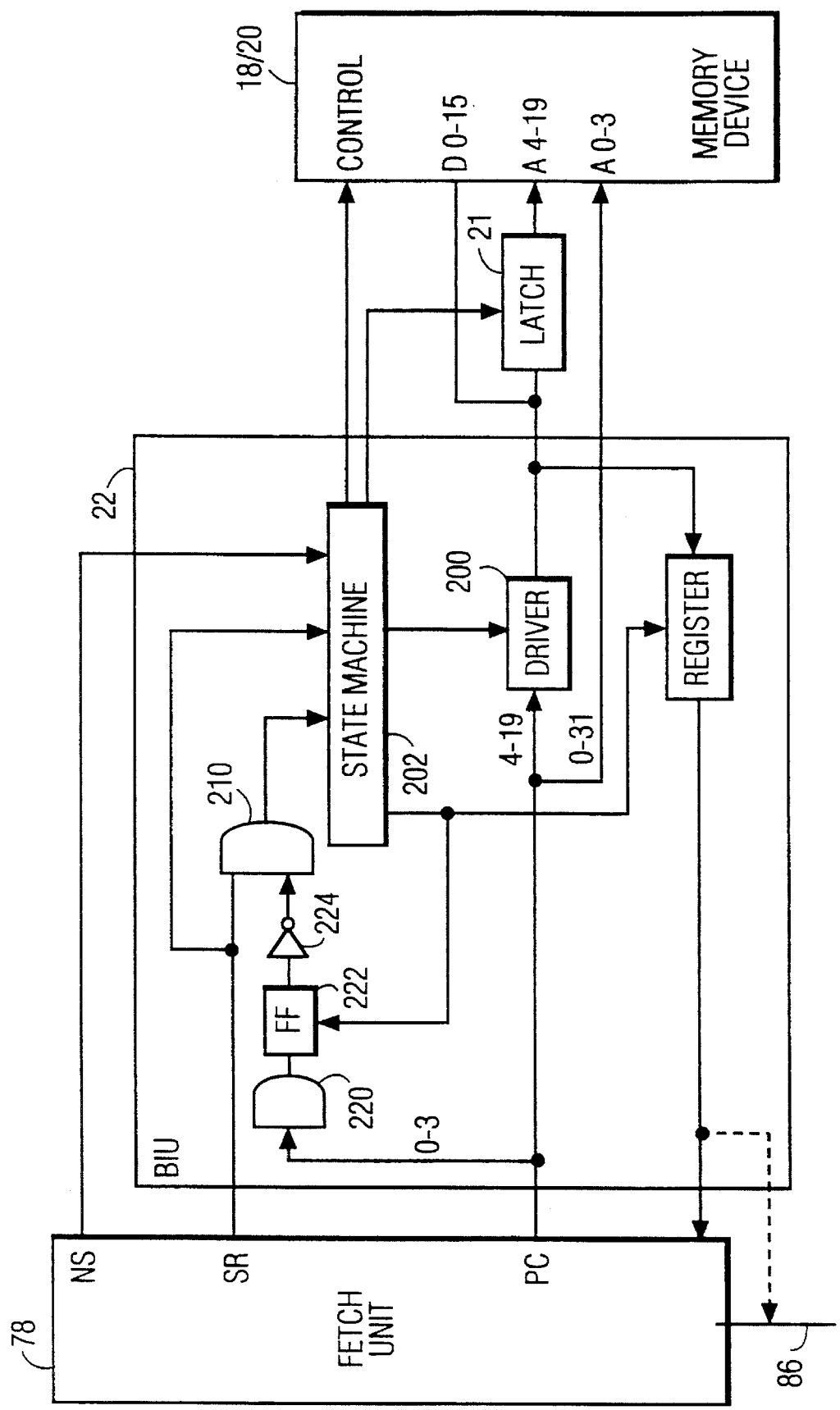
FIG. 3 illustrates a second embodiment of the present invention.

The circuit discussed above is one example of the present invention and an alternate embodiment is illustrated in FIG. 3. In this embodiment an AND gate 220, in the last clock cycle of the fetch instruction, produces a signal when all of the LSB of the address are "1". This occurs in a sequential instruction fetch cycle just before the higher MSB of the address changes or are incremented. That is, if the LSB are binary "1111" and the next instruction fetched is sequential, the MSB portion of the address is incremented for the next fetch and the address latching clock cycle must be performed in the next fetch. To save this nonsequential indication for the next instruction fetch cycle a flip-flop 222 is provided to store the indication. The FF 222 is clocked at the same time the register 204 captures the data transferred. In the first clock cycle of the next fetch the content of the FF 222 is inverted by inverter 224 and presented to the gate 210. The gate 210 produces the optimization signal as long as the SR signal is presented and the last instruction LSB are not all binary "1".

The many features and advantages of the invention are apparent from the detailed specification and, thus, it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described. For example, it is possible to bring the latch 21 into the chip 12 and perform an upper order address comparison to determine whether the latch cycle for the upper order bits is necessary. It is also possible to incorporate a prefetch circuit, that performs prefetch address generation and instruction fetch initiation, into the present invention and further improved sequential fetch transfer speed. Accordingly all suitable modifications and equivalents may be resorted to, falling within the scope of the invention.

What is claimed is:

1. A bus interface unit of a microcontroller producing a fetch address for an address latch and a memory, connected to the latch, said unit comprising:

means for directly applying low order bits of the address to the memory;

means for applying high order bits of the address to the latch;

means for detecting whether current low order address bits are a sequential address of prior low order address bits of a prior fetch; and enable means for providing a latch enable to signal to the latch responsive to the detecting means.

2. A unit as recited in claim 1, wherein said circuit comprises:

an OR gate connected to receive the low order address; and an AND gate connected to said enable means, said OR gate and to receive a sequential request signal.

3. A unit as recited in claim 1, wherein said circuit comprises:

a first AND gate connected to receive the low order address;

a flip-flop connected to said first AND gate; and a second AND gate connected to said enable means, said flip-flop and to receive a sequential request signal.

4. A bus interface unit of a microcontroller producing a fetch address for an address latch and a memory, connected to the latch, said unit comprising:

means for directly applying low order bits of the address to the memory;

means for applying high order bits of the address to the latch;

enable means for providing a latch enable signal to the latch responsive to detection of a sequential address;

a first AND gate connected to receive the low order address;

a flip-flop connected to said first AND gate; and a second AND gate connected to said enable means, said flip-flop and to receive a sequential request signal and indicating detection of the sequential address.

5. A computer system, comprising:

a memory having high and low order address inputs and storing data to be fetched;

a latch connected to high order address lines of said memory; and a computer connected to said latch and said memory, said computer including a fetch unit producing a fetch address, a sequential fetch request signal indicating a sequential address fetch, and a bus interface unit connected between said fetch unit and said latch, and being adapted to selectively increase fetch speed by decreasing the fetch cycle in response to the receipt of said fetch request signal indicating a sequential address fetch.

6. A method of fetching data from a memory, comprising:

a) applying a low order fetch address to a memory and a high order fetch address to a latch;

b) determining whether the low order fetch address indicates a sequential fetch;

c) producing a high order address latch signal when the low order fetch address is not sequential; and d) fetching the data using the low order and high order fetch address.

7. A bus interface unit of a microcontroller producing a fetch address for an address latch and a memory, connected to the latch, said unit comprising:

means for directly applying low order bits of the address to the memory;

means for applying high order bits of the address to the latch;

means for receiving a signal indicating that the current address bits are a sequential address of prior bits of a prior fetch; and means for selectively increasing fetch speed by decreasing the fetch cycle in response to said signal.

* * * * *